United States Patent [19]

Viswanathan et al.

[11] Patent Number: 5,212,588
[45] Date of Patent: May 18, 1993

[54] REFLECTIVE OPTICAL IMAGING SYSTEM FOR EXTREME ULTRAVIOLET WAVELENGTHS

[75] Inventors: Vriddhachalam K. Viswanathan; Brian E. Newnam, both of Los Alamos, N. Mex.

[73] Assignee: The United States of America as represented by the United States Department of Energy, Washington, D.C.

[21] Appl. No.: 682,780

[22] Filed: Apr. 9, 1991

[51] Int. Cl.$^5$ .............................................. G02B 5/10
[52] U.S. Cl. ..................................... 359/355; 359/859
[58] Field of Search ............... 359/355, 365, 366, 708, 359/709, 726, 727, 728, 729, 730, 731, 858, 859, 861, 868

[56] References Cited

U.S. PATENT DOCUMENTS

| | | | |
|---|---|---|---|
| 3,527,526 | 9/1970 | Silvertooth | 359/859 |
| 3,748,015 | 7/1973 | Offner | 359/859 |
| 4,130,757 | 12/1978 | Frasher et al. | 359/366 |
| 4,240,707 | 12/1980 | Wetherell et al. | |
| 4,293,186 | 10/1981 | Offner | 359/366 |
| 4,798,450 | 1/1989 | Suzuki | 359/366 |
| 4,804,258 | 2/1989 | Kebo | |
| 4,812,028 | 3/1989 | Matsumoto | 350/444 |
| 4,861,148 | 8/1989 | Sato et al. | 359/366 |
| 4,863,253 | 9/1989 | Shafer et al. | 359/859 |
| 4,891,663 | 1/1990 | Hirose | 355/71 |
| 5,063,586 | 11/1991 | Jewell et al. | 378/34 |

FOREIGN PATENT DOCUMENTS 0252734 1/1988 European Pat. Off.

OTHER PUBLICATIONS

O. R. Wood II et al., "Short-Wavelength Annular-Field Optical System for Imaging Tenth Micron Features," 7 J. Vac. Sci. Technol., No. 6, pp. 1613-1615, (1989).

D. A. Markle, "The Future and Potential of Optical Scanning Systems," Solid State Technology, pp. 159-166 (1984).

T. E. Jewell et al., "20:1 Projection Soft X-Ray Lithography Using Tri-Level Resist," 1263 SPIE Electron-Beam, X-Ray, and Ion-Beam Technology: Submicrometer Lithographies IX, pp. 90-98 (1990).

S. T. Yang et al., "Effect of Central Obscuration on Image Formation in Projection Lithography," 1264 SPIE Optical/Laser Microlithography III, pp. 477-485 (1990).

J. B. Buckley et al., "Step and Scan: A System Overview of a New Lithography Tool," 1088 SPIE Optical/Laser Microlithography II, pp. 424-433 (1990).

B. E. Newnam, "Development of Free-Electron Lasers for XUV Projection Lithography," 1227 SPIE Free-Electron Lasers and Applications, pp. 116-133 (1990).

Communication from Dave Shafer to Brian Newnam dated May 18, 1990.

Primary Examiner—Bruce Y. Arnold
Assistant Examiner—R. D. Shafer
Attorney, Agent, or Firm—Ray G. Wilson; Paul D. Gaetjens; William R. Moser

[57] ABSTRACT

A projection reflection optical system has two mirrors in a coaxial, four reflection configuration to reproduce the image of an object. The mirrors have a spherical reflection surfaces to provide a very high resolution of object feature wavelengths less than 200 μm, and preferably less than 100 μm. An image resolution of features less than 0.05-0.1 μm, is obtained over a large area field; i.e., 25.4 mm ×25.4 mm, with a distortion less than 0.1 of the resolution over the image field.

6 Claims, 4 Drawing Sheets

REFLECTIVE OPTICAL IMAGING SYSTEM FOR EXTREME ULTRAVIOLET WAVELENGTHS

This invention is the result of a contract with the Department of Energy (Contract No. W-7405-ENG-36).

BACKGROUND OF THE INVENTION

This invention relates to optical projection exposure systems for use in the manufacture of semiconductor devices and, more particularly, to reflective, reducing projection exposure optics having very high resolution under illumination of photons with wavelengths less than 200 nm.

Advanced lithographic technologies capable of producing features of $\leq 0.2$ μm and with high silicon-wafer throughput are needed to meet the demand for larger, faster, and more complex integrated circuits. The present technology for optical projection lithography cannot obtain such a high resolution over a large image field, e.g., an inch square, with a practical depth of focus, i.e., at least 1 μm. The main limitations have been: 1) lack of a source having wavelengths <100 nm with sufficient average power and 2) lack of a high-resolution, low-distortion optical system operating at these short wavelengths.

The free-electron laser (FEL) is now being developed as a source of short-wavelength photons; see, e.g., U.S. Pat. No. 4,917,447, issued Apr. 17, 1990, to Newnam, and U.S. Pat. application Ser. No. 623,866, filed Dec. 7, 1990, now U.S. Pat. No. 5,144,193, issued Sep. 1, 1992, both incorporated herein by reference. Operating at wavelengths less than 200 nm and preferably at wavelengths less than 20 nm, FEL's driven by rf linear accelerators will fulfill the wavelength and average-power source requirements of projection lithography to enable feature resolution of less than 0.1 μm. As used herein, wavelengths less than 200 nm will be referred to as XUV wavelengths. It will be appreciated that a static or dynamic random access memory (SRAM or DRAM) integrated circuit with 25 mm×25 mm dimensions and with 0.1 μm features would have about a 1 GByte memory capacity, the equivalent of a present generation supercomputer. Indeed, such an extension of existing optical lithographic technologies will enable the next generation of electronics to be designed and built.

Existing projection optical systems for XUV cannot produce 0.1 μm features over a field of view large enough for the photolithographic production of practical integrated circuits. Resolution of 0.1 μm and 0.05 μm features has been demonstrated by AT&T Bell Laboratories, T. E. Jewell et al., "20:1 Projection Soft X-ray Lithography Using Tri-level Resist," 1263 SPIE Electron-Beam, X-Ray, and Ion-Beam Technology: Submicrometer Lithographies IX, pp. 90–95 (1990), incorporated herein by reference. The magnet undulator in the National Synchrotron Light Source VUV storage ring followed by a pinhole to attain full spatial coherence was the light source. The projection optics was a 20:1-reduction, Schwarzschild two-mirror, two-reflection system. At an exposure wavelength of 36 nm, 0.2 μm lines and spaces were produced in a trilayer resist. Subsequent exposures at 14 nm produced 0.1 μm and 0.05 μm features with small numerical aperture (NA) values of 0.08 and 0.12, respectively. The image field, however, was limited to 25×50 μm.

In one prior art optical design (see Design 11, below), two coaxial spherical mirrors are provided in a partially obscured system to provide a 3.3×image reduction with four reflections. The general configuration is similar to applicants' configuration shown in FIG. 1. In one design a NA of 0.150 produces an image field of 5 mm×5 mm with a resolution of 0.1 μm at a wavelength of 20 nm. In another design, a NA of 0.125 produces an image field of 10 mm×10 mm with a resolution of 0.1 μm when illuminated with an incoherent light source at a wavelength of 13 nm. Both designs use a 40% central obscuration. However, even with these small field sizes, the image distortion is as large as 0.25 μm, whereas the required distortion is $\leq 0.01$ μm for 0.1 μm resolution over the entire image field. It can be shown that the required resolution can be obtained at these wavelengths over a field of only 1.4 mm×1.4 mm. At practical field sizes, e.g., 25.4mm×25.4mm, the maximum resolution is 0.15 μm using 10 nm illumination with a distortion of 3.6 μm. This is clearly unacceptable performance for the advanced lithography system under development. Accordingly, it is an object of the present invention to resolve image features to $\leq 0.2$ μm using illuminated wavelengths less than 100 nm.

It is another object of the present invention to provide the desired resolution with a distortion less than 0.1×resolution over image fields greater than 10mm×10mm.

Yet another object of the present invention is to provide an optical system compatible with existing scanner and stepping equipment for very large area projection.

Still another object of the present invention is to maintain a telecentricity of less than 5 milliradians (mr) to provide an acceptable depth of focus, e.g., about 1 μm.

It is yet another object of the present invention to provide the desired resolution and substantially distortionless image at practical tolerances for optical systems, i.e., surface roughness, dimensional tolerances, alignment tolerances, etc.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise first and second coaxial four reflecting surfaces between an object and an image field coaxial with the mirrors for resolving image features of 0.05–0.25 μm with a telecentricity of $\leq 5$ mrad and distortions less than 0.1 of the resolution over an image field of at least 10mm×10mm when illuminated with a partially coherent photon beam having a wavelength less than about 100 nm.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Figure 1:
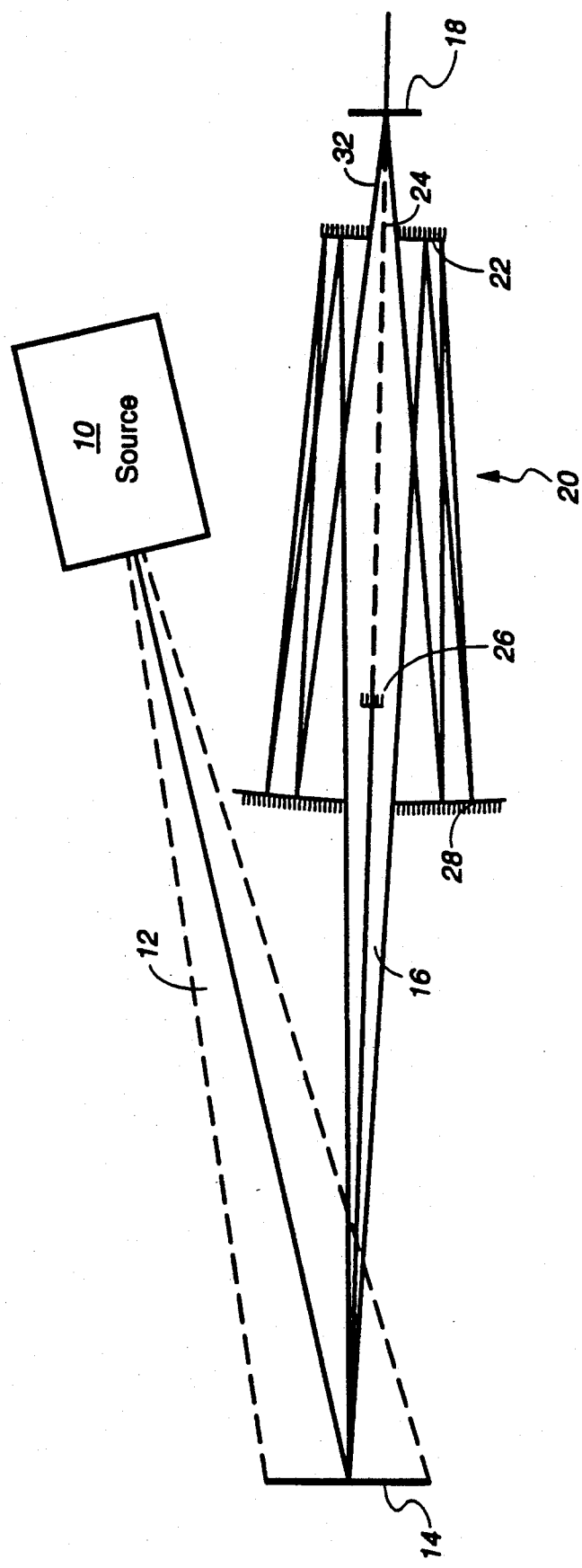
FIG. 1 is a schematic drawing in partial cross-section of a projection reflection optical system according to the present invention.

Referring first to FIG. 1, there is shown in schematic illustration, in partial cross-section, a projection reflection optical system in accordance with the present invention. A photon source 10 emits partially coherent photon beam 12 that is incident on a target 14. In a preferred embodiment, photon source 10 is a free electron laser (FEL) emitting photons with a wavelength less than 200 nm, and preferably around 10–60 nm. Other photon sources are available for emitting photons in the desired wavelength range, e.g., a synchrotron light source such as the National Synchrotron Light Source at Brookhaven National Laboratories. Target 14 is a mask representing the desired circuit design to be printed onto a semiconductor wafer. While FIG. 1 shows a reflection mask, it is apparent that a transmission mask could be used by placing mask 14 between source 10 and target wafer 18.

The projection system comprises the reflecting optics 20 disposed between mask 14 and semiconductor wafer 18. In one embodiment of the present invention, wafer 18 is at least 10mm×10mm and is to be illuminated through optics 20 without scanning or stepping of an image over the surface of wafer 18. In a second embodiment, wafer 18 may have an arbitrarily large diameter and is stepped by a conventional precision translation mechanism to expose a plurality of different image fields each having a dimension of at least 10mm×10mm. The optics may also be included in a scanning system, e.g., a Micrascan system developed by The Perkin-Elmer Corporation, to extend the image field size beyond that obtained with nonscanning optics.

Features at least as small as 0.25 μm, and preferably 0.1 μm, are printed on wafer 18 with essentially no distortion over the image field occupied by wafer 18, assuming ideal reflection surfaces in optics 20. Further, a maximum telecentric angle of 1 mr is maintained from the image plane defined by wafer 18 in order to provide an acceptable depth of focus, e.g., 1 μm. Optics 20 maintain a distortion over the image field of wafer 18 of less than 0.1 of the resolution (see Table A) even when various manufacturing tolerances are introduced into optics 20.

Photon beam 12 is a partially coherent source, i.e., having an adjustable partial coherence factor, typically 0.4–1.0, where the partial coherence factor (σ or RNA) is the ratio of the numerical aperture (NA) of the condensing system (output optics of laser 10) to that of the imaging system (optics 20), both NA's being measured at the mask plane. This value affects how close to a step function in intensity the optical system actually reproduces in the wafer resist plane.

Figure 4:
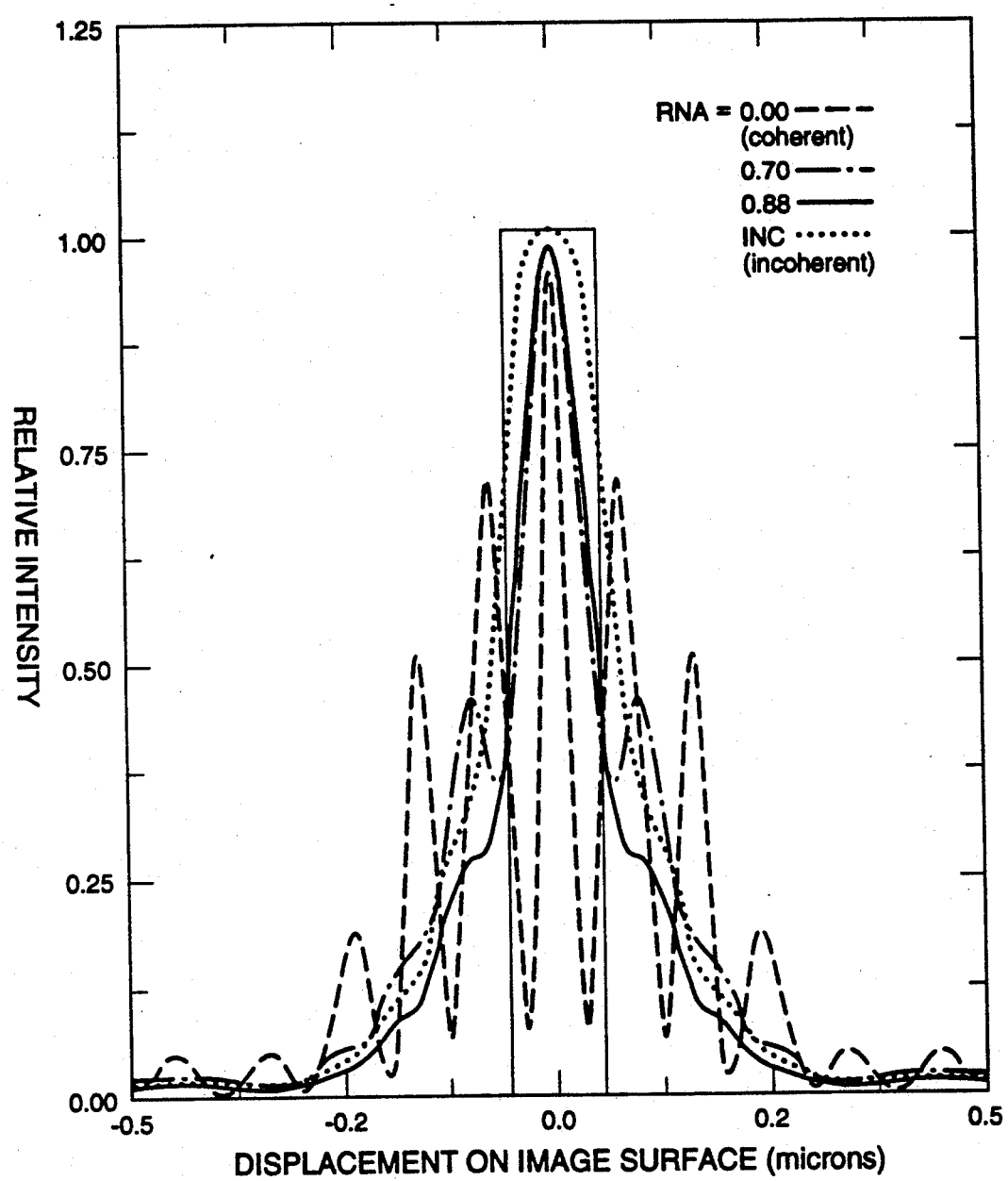
FIG. 4 graphically depicts the resolution capability of the present optical system in the image plane when the object is illuminated with a beam having various partial coherence factors (RNA).

FIG. 4 graphically depicts the relative beam intensity as a function of displacement on the image surface for a system imaging over 25.4mm×25.4mm at 13 nm with NA 0.11. A 0.1 μm wide line is shown to illustrate the required resolution. A totally coherent beam (RNA=0) has a number of high peaks outside the required resolution that would provide an undesirable broadening of the image. At RNA=0.70, the number of peaks is reduced, but some undesirable peaks still exist outside the 0.1 μm lines. An acceptable resolution is obtained for RNA 0.88 and 1.00. The beam displacement begins to broaden as the beam incoherence increases and the resolution becomes unacceptable for totally incoherent light. The optimum partial coherence factor must be computed for each particular system. The present system design provides the desired resolution and distortion for RNA values in the range 0.8–1.

Optical system 20 is a partially obscured reflecting system comprising a first aspherical convex reflecting surface 22 defining a hole 24 therethrough for exiting beam 32 to wafer 18. a second aspherical concave reflecting surface 28 defining a hole therethrough for admitting photons 16 from mask 14. The central portion of beam 16 is blocked by obscurator 26 from illuminating wafer 18. A preferred obscuration is 0.4, i.e., 40% of the incident photons are blocked by obscuration 26.

It will be understood that photons in a beam 16 originating from mask 14 will reflect first from surface 22, second from surface 28, third from surface 22, and fourth from surface 28 before forming beam 32 incident on wafer 18. Thus, four reflections occur from two reflecting surfaces with the first and third surfaces 22 and the second and fourth surfaces 28 being located on the same aspherical mirrors. Reflecting surfaces 22. 28 are formed from coatings on aspheric substrates that are appropriate to reflect the selected wavelength of beam 16. See, e.g., O. R. Wood II et al., "Short-Wavelength Annular-Field Optical System For Imaging Tenth-Micron Features," 7 J. Vac Sci. Technol. B, No. 6, pp. 1613–1615 (1989), incorporated herein by reference.

In accordance with the present invention, it has been found that an image of mask 14 can be reduced by at least 3.3× and projected with negligible distortion, i.e., less than 0.1 of the resolution, onto image frames greater that 10mm×10mm when the following design conditions are met:

1. The ratio of the radius of curvature of surface 22 to surface 28 is in the range 0.98 to 1.02. This condition is needed to make the Petzval sum sufficiently close to zero that the image is in an acceptably flat plane.

2. The distance between surface 22 and surface 28 has to obey the inequality $$0.48 \leq \frac{\text{Distance Between Mirrors}}{\text{Radius of Curvature of surface 22 and surface 28}} \leq 0.54$$

where the relationship must be satisfied by both surface 22 and surface 28 in order for the higher aberrations to cancel before the image is formed.

3. The conic constant and the actual conic shape determined by Equation 1, below, are selected to balance the higher-order field curvature without degrading image quality.

4. The aspheric coefficients are selected to reduce the distortion to levels equal to or less than 0.1 of the resolution.

The optical performance of aspheric surfaces may be determined by suitable computer software, e.g. Code V available from Optical Research Associates, Pasadena, CA, to optimize the resolution and distortion. When all of the above conditions are simultaneously satisfied according to the present invention, it is found that an image resolution of at least 0.1 μm can be obtained over large image areas with a distortion of less than 0.1 of the resolution.

This surprising result provides a reflective reducing projection system that is relatively simple to align, i.e., two coaxial reflecting surfaces, and is tolerant of conventional manufacturing processes.

As used herein, the aspheric surfaces are characterized by the conventional formula:

$$Z = \frac{ch^2}{1 + SQRT\{1 - (1+K)c^2h^2\}} + Ah^4 + Bh^6 + Ch^8 + Dh^{10} \quad (1)$$

where
Z is the sag of the surface parallel to the Z axis;
c is the curvature at the vertex of the surface;
K is the conic constant, where

| | |
|---|---|
| $K = 0$ | sphere |
| $0 > K > -1$ | ellipsoid with major axis on the optical axis |
| $K = -1$ | paraboloid |
| $K < -1$ | hyperboloid |
| $K > 0$ | oblate spheroid |

A,B,C,D are the 4th, 6th, 8th, 10th order deformation coefficients (A=B=C=D for a pure conic).
$h^2 = X^2 + Y^2$; i.e. h is a height above the Z axis X and Y are dimensions on the other two orthogonal axes.

Figure 2:
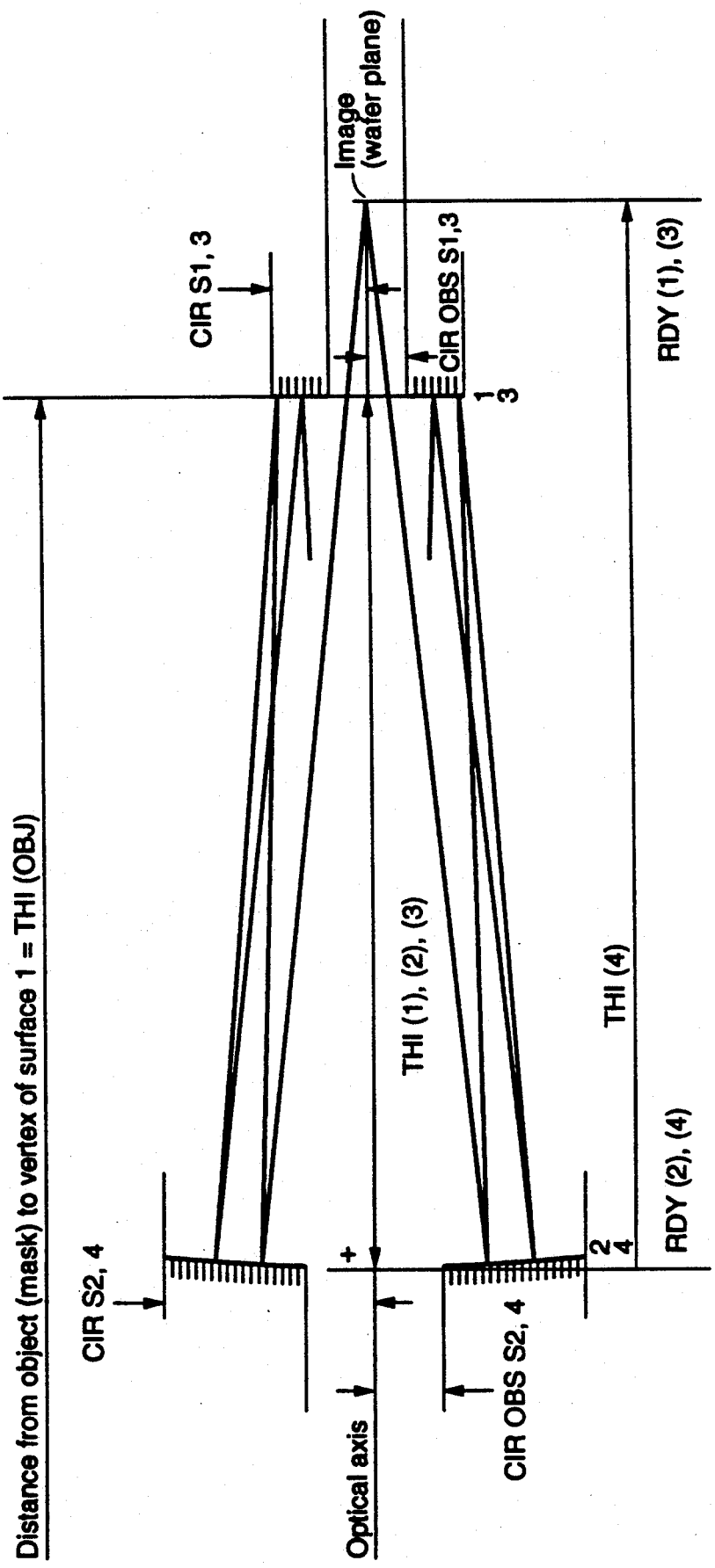
FIG. 2 illustrates the location of exemplary design dimensions.

To illustrate the capabilities of the aspherical mirror design, design examples 1–11 are presented below, where design 11 is a prior art design using spherical mirrors. Referring now to FIG. 2, there is defined the design dimensions. It will be understood that surfaces 1 and 3 are the same and surfaces 2 and 4 are the same. All linear dimensions are in millimeters unless otherwise noted, and are not separately labeled. The numerical values are presented as computer output. In practical application, the dimensions will be rounded to two decimal places and the aspherical parameters to two significant figures.

Figure 3:
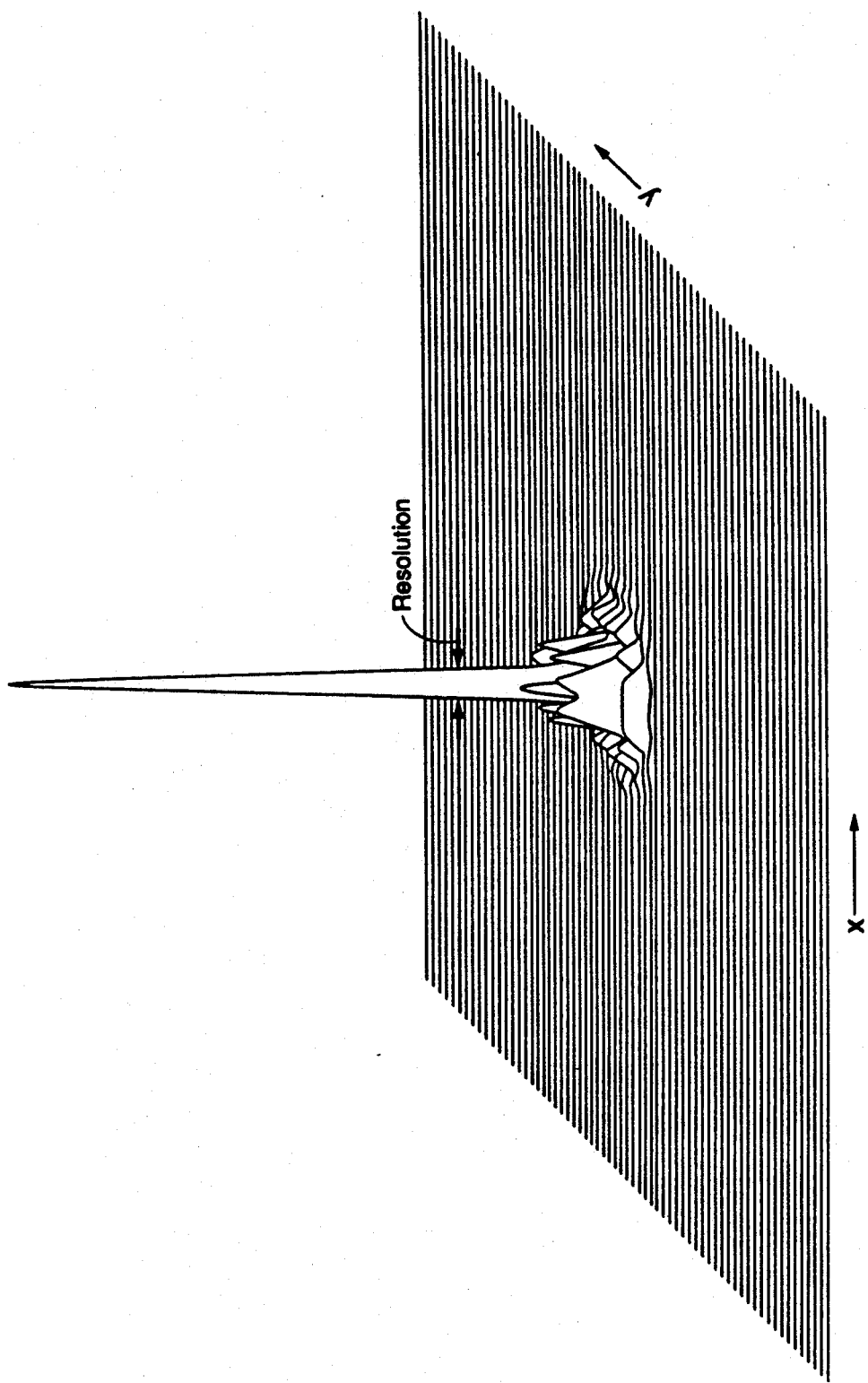
FIG. 3 graphically depicts a diffraction intensity spread function showing the aerial image resolution capability of an optical system according to the embodiments of the invention presented herein.

FIG. 3 illustrates a typical diffraction intensity spread function for the exemplary designs showing the diffraction intensity variation in the image plane. The bottom portion of the function must be below the resolution sensitivity of a selected photoresist so that the resist responds only to the narrow peak portion of the function. The width of the peak function defines the aerial image resolution available from a given design. A design with high level peripheral peaks would be unacceptable.

FIG. 4 illustrates the effect of the partial coherence factor on the diffraction intensity profile. The effective resolution is again defined by the spread of the curve at a relative intensity that affects the resist. A suitable partial coherence factor is selected to provide a diffraction intensity within the selected profile above the resist sensitivity and with sufficient power within the profile to expose the resist. The following exemplary designs were evaluated with a partial coherence factor in the range 0.8 to 1.0.

Each design includes the following items: basic hyperbolic with higher order deformations, for use

| DESIGN PARAMETERS | |
|---|---|
| NA | Numerical aperture in image space |
| WL | Wavelength used in nanometers |
| XOB | Object point in mask field (for evaluation) |
| YOB | Object point in mask field (for evaluation) |
| RDY | Radius of curvature |
| THI | Separation between surfaces |
| RMD-GLA | Describes the nature of material between surfaces and event on surface (air, lens, mirror, etc.) |
| CIR | Radius of surface |
| CIR OBS | Radius of aperture |
| STO | Surface 3; location of the aperture stop |
| K, A, B | Values for aspherical surfaces; C = D = 0, unless otherwise noted. |

DESIGN 1

| NA = 0.11 | WL = 13 | Image Size = 25.4 × 25.4 | |
|---|---|---|---|
| | Field 1 | Field 2 | Field 3 |
| XOB | 0.00000 | 0.00000 | 0.00000 |
| YOB | 0.00000 | 42.33850 | 59.87568 |

| | RDY | THI | RMD | GLA |
|---|---|---|---|---|
| OBJ: | Infinity | 2112.445332 | | AIR |
| 1 | 1777.57409 | −913.342638 | REFL | AIR |
| 2 | 1779.26774 | 913.342638 | REFL | AIR |
| STO: | 1777.57409 | −913.342683 | REFL | AIR |
| 4 | 1779.26774 | 1116.395075 | REFL | AIR |
| IMG: | Infinity | 0.000000 | | AIR |

| APERTURE DATA/EDGE DEFINITIONS | |
|---|---|
| CIR S1,3 | 99.900000 |
| CIR OBS 1,3 | 45.000000 |
| CIR S2,4 | 220.000000 |
| CIR OBS 2,4 | 75.000000 |

| ASPHERICAL PARAMETERS | |
|---|---|
| S1,3 | K = −1.0792218744 |
| | A = −0.44886622E-10 |
| | B = −0.58712169E-16 |
| S2,4 | K = −0.120004294299 |
| | A = −0.44502823E-11 |
| | B = −0.47581115E-17 |

DESIGN 2

| NA = 0.11 | WL = 13 | Image Size = 40 × 0.25 | |
|---|---|---|---|
| | Field 1 | Field 2 | Field 3 | Field 4 |
| XOB | 0.00000 | 46.84620 | 47.14620 | 47.44620 |
| YOB | 0.00000 | 47.44620 | 47.14620 | 46.84620 |

| | RDY | THI | RMD | GLA |
|---|---|---|---|---|
| OBJ: | Infinity | 2112.461005 | | AIR |
| 1: | 1777.59247 | −913.336954 | REFL | AIR |
| 2: | 1779.26508 | 913.336954 | REFL | AIR |
| STO: | 1777.59247 | −913.336954 | REFL | AIR |
| 4: | 1779.26508 | 1116.382811 | REFL | AIR |
| IMG: | Infinity | 0.000000 | | AIR |

| APERTURE DATA/EDGE DEFINITIONS | |
|---|---|
| CIR S1,3 | 100.000000 |
| CIR OBS 1,3 | 41.115000 |
| CIR S2,4 | 200.000000 |
| CIR OBS 2,4 | 80.000000 |

| ASPHERICAL PARAMETERS | |
|---|---|
| S1,3 | K = −1.07851182545 |
| | A = −0.44869423E-10 |
| | B = −0.59169516E-16 |
| S2,4 | K = −0.113293055237 |
| | A = −0.45937664E-11 |
| | B = −0.4862S754E-17 |

DESIGN 3

| NA = 0.2 | WL = 60 | Image Size = 30 × 30 |
|---|---|---|
| | Field 1 | Field 2 |

-continued

DESIGN PARAMETERS

| | XOB | 0.00000 | 0.00000 | |
|---|---|---|---|---|
| | YOB | 0.00000 | 72.56542 | |
| | RDY | THI | RMD | GLA |
| OBJ: | Infinity | 2179.315832 | | AIR |
| 1: | 1762.59624 | −917.387909 | REFL | AIR |
| 2: | 1779.78410 | 917.387909 | REFL | AIR |
| STO: | 1762.59624 | −917.387909 | REFL | AIR |
| 4: | 1779.78410 | 1116.395648 | REFL | AIR |
| IMG: | Infinity | 0.000000 | | AIR |

APERTURE DATA/EDGE DEFINITIONS

| CIR S1,3 | 180.000000 |
|---|---|
| CIR OBS 1,3 | 65.000000 |
| CIR S2,4 | 334.000000 |
| CIR OBS 2,4 | 76.000000 |

ASPHERICAL PARAMETERS

| S1,3 | K = −1.05917603497 |
|---|---|
| | A = −0.44866691E-10 |
| | B = −0.59681694E-16 |
| | C = 0.76701423E-23 |
| S2,4 | K = −0.111128812476 |
| | A = −0.44963481E-11 |
| | B = −0.45136SSIE-17 |
| | C = 0.28646191E-23 |

DESIGN 4

NA = 0.25  WL = 60  Image Size = 25.4 × 25.4

| | Field 1 | Field 2 | Field 3 |
|---|---|---|---|
| XOB | 0.00000 | 0.00000 | 43.85237 |
| YOB | 0.00000 | 43.85237 | 43.85237 |

| | RDY | THI | RMD | GLA |
|---|---|---|---|---|
| OBJ: | Infinity | 2204.396014 | | AIR |
| 1: | 1757.45553 | −918.922730 | REFL | AIR |
| 2: | 1780.00067 | 918.922730 | REFL | AIR |
| STO: | 1757.45553 | −918.922730 | REFL | AIR |
| 4: | 1780.00067 | 1116.173808 | REFL | AIR |
| IMG | Infinity | 0.000000 | | AIR |

APERTURE DATA/EDGE DEFINITIONS

| CIR S1,3 | 224.000000 |
|---|---|
| CIR OBS 1,3 | 130.000000 |
| CIR S2,4 | 406.000000 |
| CIR OBS 2,4 | 250.000000 |

ASPHERICAL PARAMETERS

| S1,3 | K = −1.05356782398 |
|---|---|
| | A = −0.44825057E-10 |
| | B = −0.56374571E-16 |
| | C = −0.1825881E-22 |
| S2,4 | K = −1.109800068715 |
| | A = −0.447177E-11 |
| | B = −0.43106911E-17 |
| | C = −0.32960971E-23 |

DESIGN 5

NA = 0.125  WL = 60  Image Size = 45 × 15

| | Field 1 | Field 2 | Field 3 |
|---|---|---|---|
| XOB | 0.00000 | 0.00000 | 0.00000 |
| YOB | 0.00000 | 55.34662 | 79.06660 |

| | RDY | THI | RMD | GLA |
|---|---|---|---|---|
| OBJ: | Infinity | 2112.461005 | | AIR |
| 1: | 1777.59247 | −913.336954 | REFL | AIR |
| 2: | 1779.26508 | 913.336954 | REFL | AIR |
| STO: | 1777.59247 | −913.336954 | REFL | AIR |
| 4: | 1779.26508 | 1116.382811 | REFL | AIR |
| IMG: | Infinity | 0.000000 | | AIR |

APERTURE DATA/EDGE DEFINITIONS

| CIR S1,3 | 110.800000 |
|---|---|
| CIR OBS 1,3 | 48.000000 |
| CIR S2,4 | 218.400000 |
| CIR OBS 2,4 | 80.000000 |

ASPHERICAL PARAMETERS

| S1,3 | K = −1.0785118245 |
|---|---|
| | A = −0.44869423E-10 |
| | B = −0.59169516E-16 |
| S2,4 | K = −0.113293055237 |

-continued

DESIGN PARAMETERS

| | A = −0.45937664E-11 |
|---|---|
| | B = −0.48628754E-17 |

DESIGN 6

NA = 0.3  WL = 193  Image Size = 20 × 20

| | Field 1 | Field 2 |
|---|---|---|
| XOB | 0.00000 | 0.00000 |
| YOB | 0.00000 | 48.37697 |

| | RDY | THI | RMD | GLA |
|---|---|---|---|---|
| OBJ: | Infinity | 2181.511134 | | AIR |
| 1: | 1764.53736 | −917.308729 | REFL | AIR |
| 2: | 1780.03913 | 917.308729 | REFL | AIR |
| STO: | 1764.53736 | −917.308729 | REFL | AIR |
| 4: | 1780.03913 | 1115.459595 | REFL | AIR |
| IMG: | Infinity | 0.000000 | | AIR |

APERTURE DATA/EDGE DEFINITIONS

| CIR S1,3 | 270.000000 |
|---|---|
| CIR OBS 1,3 | 180.000000 |
| CIR S2,4 | 476.000000 |
| CIR OBS 2,4 | 320.000000 |

ASPHERICAL PARAMETERS

| S1,3 | K = −1.01121952725 |
|---|---|
| | A = −0.43782954E-10 |
| | B = −0.53282998E-16 |
| | C = −0.26252808E-22 |
| S2,4 | K = −0.106613504476 |
| | A = −0.43876219E-11 |
| | B = −0.40585805E-17 |
| | C = −0.36094611E-23 |

DESIGN 7

NA = 0.08  WL = 13  Image Size = 10 × 10

| | Field 1 | Field 2 | Field 3 |
|---|---|---|---|
| XOB | 0.00000 | 0.00000 | 0.00000 |
| YOB | 0.00000 | 16.66869 | 23.57310 |

| | RDY | THI | RMD | GLA |
|---|---|---|---|---|
| OBJ: | Infinity | 2112.445332 | | AIR |
| 1: | 1777.57409 | −913.342638 | REFL | AIR |
| 2: | 1779.26774 | 913.342638 | REFL | AIR |
| STO: | 1777.57409 | −913.342683 | REFL | AIR |
| 4: | 1779.26774 | 1116.395075 | REFL | AIR |
| IMG: | Infinity | 0.000000 | | AIR |

APERTURE DATA/EDGE DEFINITIONS

| CIR S1,3 | 99.900000 |
|---|---|
| CIR OBS 1,3 | 35.000000 |
| CIR S2,4 | 178.400000 |
| CIR OBS 2,4 | 75.000000 |

ASPHERICAL PARAMETERS

| S1,3 | K = −1.0792218744 |
|---|---|
| | A = −0.44886622E-10 |
| | B = −0.58712169E-16 |
| S2,4 | K = −0.120004294299 |
| | A = −0.44502823E-11 |
| | B = −0.47581115E-17 |

DESIGN 8

NA = 0.08  WL = 10  Image Size 10 × 10

| | Field 1 | Field 2 |
|---|---|---|
| XOB | 0.00000 | 0.00000 |
| YOB | 0.00000 | 31.78014 |

| | RDY | THI | RMD | GLA |
|---|---|---|---|---|
| OBJ: | Infinity | 3395.578764 | | AIR |
| 1: | 1908.95435 | −995.239908 | REFL | AIR |
| 2: | 1944.11819 | 995.239908 | REFL | AIR |
| STO: | 1908.95435 | 995.239908 | REFL | AIR |
| 4: | 1944.11819 | 1177.992696 | REFL | AIR |
| IMG: | Infinity | 0.000000 | | AIR |

APERTURE DATA/EDGE DEFINITIONS

| CIR S1,3 | 77.500000 |
|---|---|
| CIR OBS 1,3 | 28.000000 |
| CIR S2,4 | 150.000000 |
| CIR OBS 2,4 | 85.000000 |

ASPHERICAL PARAMETERS

-continued

DESIGN PARAMETERS

| | | |
|---|---|---|
| S1,3 | K = | −0.199386899695 |
| | A = | −0.31621472E-10 |
| | B = | −0.1886711E-15 |
| | C = | 0.34375037-20 |
| S2,4 | K = | −0.021487096778 |
| | A = | −0.35616796E-11 |
| | B = | −0.50684015E-17 |
| | C = | 0.30046828E-22 |

DESIGN 9

NA = 0.15    WL = 10    Image Size = 25.4 × scan length
                        Field 1         Field 2

| | | |
|---|---|---|
| XOB | 0.00000 | 0.00000 |
| YOB | 42.00000 | 43.00000 |

| | RDY | THI | RMD | GLA |
|---|---|---|---|---|
| OBJ: | Infinity | 2113.682611 | | AIR |
| 1: | 1777.52674 | −913.375814 | REFL | AIR |
| 2: | 1779.29040 | 913.375814 | REFL | AIR |
| STO: | 1777.52674 | −913.375814 | REFL | AIR |
| 4: | 1779.29040 | 1116.317708 | REFL | AIR |
| IMG: | Infinity | 0.000000 | | AIR |

APERTURE DATA/EDGE DEFINITIONS

| | |
|---|---|
| CIR S1,3 | 134.900000 |
| CIR OBS 1,3 | 43.000000 |
| CIR S2,4 | 350.000000 |
| CIR OBS 2,4 | 78.000000 |

ASPHERICAL PARAMETERS

| | | |
|---|---|---|
| S2,4 | K = | 0.008275366943 |
| | A = | −0.20575388E-10 |
| | B = | −0.34017633E-16 |
| | C = | 0.38413684E-22 |
| S3,5 | K = | −0.011823781455 |
| | A = | −0.18384562E-11 |
| | B = | −0.19656686 |
| | C = | −0.145S0091E-23 |

DESIGN 10

NA = 0.15    WL = 10    Image Size = 14 × 14
                        Field 1    Field 2

| | | |
|---|---|---|
| XOB | 0.00000 | 23.33619 |
| YOB | 0.00000 | 23.33619 |

| | RDY | THI | RMD | GLA |
|---|---|---|---|---|
| OBJ: | Infinity | 2112.078151 | | AIR |
| 1: | 1777.13023 | −913.459893 | REFL | AIR |
| 2: | 1779.28237 | 913.459893 | REFL | AIR |
| STO: | 1777.13023 | −913.459893 | REFL | AIR |
| 4: | 1779.28237 | 1116.602503 | | |

-continued

DESIGN PARAMETERS

| | | | |
|---|---|---|---|
| IMG: | Infinity | 0.000000 | AIR |

APERTURE DATA/EDGE DEFINITIONS

| | |
|---|---|
| CIR S1,3 | 134.000000 |
| CIR OBS 1,3 | 40.000000 |
| CIR S2,4 | 350.000000 |
| CIR OBS 2,4 | 60.000000 |

ASPHERICAL PARAMETERS

| | | |
|---|---|---|
| S2,4 | K = | −1.07953019409 |
| | A = | −0.44951395E-10 |
| | B = | −0.57691058E-16 |
| | C = | −0.22368228E-22 |
| S2,4 | K = | −0.122809 |
| | A = | −0.439687E-11 |
| | B = | −0.454033E-17 |
| | C = | −0.307562E-23 |

DESIGN 11

NA = 0.125    WL = 13    Image Size = 10 × 10
                          Field 1    Field 2    Field 3

| | | | |
|---|---|---|---|
| XOB | 0.00000 | 0.00000 | 0.00000 |
| YOB | 0.00000 | 16.67357 | 23.58018 |

| | RDY | THI | RMD | GLA |
|---|---|---|---|---|
| OBJ: | Infinity | 2110.181200 | | AIR |
| 1: | 1772.51360 | −915.197560 | REFL | AIR |
| 2: | 1779.35380 | 915.197560 | REFL | AIR |
| STO: | 1772.51360 | −915.197560 | REFL | AIR |
| 4: | 1779.35380 | 1117.554340 | REFL | AIR |
| IMG: | Infinity | 0.000000 | | AIR |

APERTURE DATA/EDGE DEFINITIONS

| | |
|---|---|
| CIR S1,3 | 110.490600 |
| CIR OBS 1,3 | 32.385000 |
| CIR S2,4 | 203.200000 |
| CIR OBS 2,4 | 59.055000 |

The system performance for each of the above designs has been determined and is summarized in Table A. The headings used in Table A are as follows:

TABLE A

| PERFORMANCE VALUES | |
|---|---|
| RED | reduction factor from object to image. |
| WL | wavelength range for performance values - nm. |
| NA | numerical aperture range for performance. |
| RES | resolution available over entire field in $\mu$m. |
| FIELD | field size side dimension in mm. |
| TEL | telecentricity in milliradians in image space. |
| DIST | maximum distortion over entire field in $\mu$m/% of RES. |

| DESIGN | RED | WL | NA | RES | FIELD | TEL | DIST |
|---|---|---|---|---|---|---|---|
| 1 | 3.3 | 10–20 | .08–.17 | 0.1 | 25.4X | 0.4 | .002/2 |
| 2 | 3.3 | 10–20 | .08–.17 | 0.1 | 40 × 0.25 | 0.4 | .008/8 |
| 3 | 3.3 | 40–60 | .2–.25 | 0.15 | 30X | 0.45 | .004/3 |
| 4 | 3.5 | 40–60 | .25–.3 | 0.15 | 25.4X | 0.5 | .004/3 |
| 5 | 3.3 | 40–60 | .12–.2 | 0.17 | 45 × 15 | 0.7 | .005/5 |
| 6* | 3.3 | 190–200 | .30 | 0.25 | 20X | 0.3 | .05/20 |
| 7 | 3.3 | 10–20 | .08–.13 | 0.05 | 10X | 0.15 | .0007/1.4 |
| 8* | 4.5 | 10–20 | .08 | 0.1 | 10X | 0.1 | .01/10 |
| 9 | 3.3 | 10–20 | .15–.16 | 0.1 | 25.4 × scan | 0.4 | .001/1 |
| 10 | 3.3 | 10–20 | .15–.17 | 0.1 | 14X | 0.2 | .001/1 |
| 11* | 3.3 | 10–20 | .125 | 0.1 | 10X | 0.2 | .01/10 |

* Design, as evaluated, does not meet photolithography requirements as noted below.

Designs 1–10 are all aspheric designs according to the present invention. In all cases the first mirror 22 (FIG. 1) has a conic constant 0 > K > −1, i.e., a basic ellipsoid with higher order deformations. The second mirror 28 (FIG. 1,) has a conic constant K < −1, i.e., a basic hyperbolic with higher order deformations, for use in nonscanning systems (Designs 1–9). Design 10, a scanning system, illustrates mirror 28 with a conic constant $K > 0$, i.e., a basic oblate spheroid with higher order deformations.

It will be seen that Designs 6, 8, and 11 do not appear suitable for high-resolution, low-distortion lithography systems. Design 6 was evaluated at a wavelength of about 200 nm and has an unacceptable distortion for lithographic application, but other imaging applications may exist. Design 8 was evaluated at a reduction factor of 4.5× and can meet both the resolution and distortion requirements over an image field size of only 2mm×2mm. Design 11 is the prior art design and can likewise meet both the resolution and distortion requirements over an image field size of only 2mm×2mm.

The optical performance of most of the above acceptable designs is also shown in Table B by the image quality as determined by the R.M.S. value for the square root of wave aberration given in units of wavelength.

TABLE B

| System | λ nm | Center | Edge |
|--------|------|--------|------|
| 1 | 13 | .012 | .056 |
| 2 | 13 | .018 | .068 |
| 3 | 60 | .020 | .053 |
| 5 | 60 | .006 | .040 |
| 7 | 13 | .014 | .007 |
| 9 | 10 | .009 | .009 |
| 10 | 10 | .078 | .043 |

Calculated quality values $\leq 0.071\lambda$ represent diffraction limited systems.

Design 1 has been further examined to determine the sensitivity of the image quality, defined above, to tolerances of critical dimensions. Tolerances related to mirror radii, mirror spacing, and tilt angle were varied until image quality was no longer diffraction limited. The resulting tolerances and field image effects for Design 1 are shown in Table C.

TABLE C

| | | |
|---|---|---|
| R (Radius) | ±0.0005 mm = ±0.5 μm | |
| S (Spacing) | ±0.0001 mm = ±0.1 μm | |
| T (Tilt Angle) | 4 micro-radians | |
| Image Field (across diagonal) | Nominal RMS (λ units) | Toleranced RMS (λ units) |
| Axis | 0.012 | 0.025 |
| .7 to edge | 0.024 | 0.040 |
| Edge of Image | 0.056 | 0.071 |

These tolerances are well within the state-of-the-art for precision mirror fabrication and the dimensional changes under expected operating conditions. The distortion remained less than 0.1 of the resolution value. By way of comparison, a tilted, de-centered, four-mirror system, similar to that shown by European Patent Application No. 87306037.0, published Jan. 1, 1988, requires the following tolerances to remain a diffraction limited system:

| | |
|---|---|
| Radius | ±0.001 μm |
| Spacing | ±0.001 μm |
| Tilt | ±0.1 micro-radians |

Even with these very tight tolerances, the distortion increases to 0.2 of the resolution values.

The optical projection systems according to the present invention have other significant performance characteristics. A standard telecentricity value is 5 mr, whereas the subject designs provide a telecentricity of $\leq 0.7$ mr over the large field area. This provides a large axial distance within which the image plane may be located. The aspherical surfaces are only slight departures from best-fit spheres as shown in Table D. The small deviations introduced by the aspherecity herein are well within existing manufacturing capabilities.

TABLE D

| Design Deviation from Best Fit Sphere | | |
|---|---|---|
| Design | Mirror 22 (μm) | Mirror 28 (μm) |
| 1 | 1.1 | 1.5 |
| 2 | 1.2 | 1.7 |
| 5 | 1.7 | 3.2 |
| 7 | 1.3 | 1.3 |
| 8 | 0.2 | 0.2 |

Thus, an optical projection system is provided herein that is capable of photolithographic exposures with 0.1 μm resolution and distortions less than 0.1 of the resolution value. The image fields can be at least 25.4mm×25.4mm for a single projection, nonscanning exposure, or can have a field width of 25.4mm and scanned in small steps over any desired length. In addition to lithography, these high resolution optical systems are also expected to have significant application in other technical fields, i.e., biotechnology.

The foregoing description of embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A reflecting optical system including illumination means for projecting an image of an object, said optical system further defining an image plane for receiving a reduced image representation of said object, the improvement comprising:

first and second coaxial aspherical mirrors in partially obscured arrangement and defining four reflecting surfaces between said object and said image plane coaxial with said mirrors, said first and second mirrors being defined by aspherical coefficients effective to resolve image features of 0.05–0.25 μm with a telecentricity ≤ 1 mrad with distortions less than 0.1 of a resolution value for said object over an image filed in said image plane of at least 10 mm × 10 mm when said illumination means is a partially coherent photon beam having a wavelength less than about 100 nm;

wherein said first aspherical mirror receives illumination from said object and has a conic constant $K < -1$; and said second mirror directs illumination onto said image plane and has a conic constant $0 > K > -1$.

2. A reflecting optical systems including illumination means for projecting an image of an object, said optical system further defining an image plane for receiving a reduced image representation of said object, the improvement comprising:

first and second coaxial aspherical mirrors in partially obscured arrangement and defining four reflecting surfaces between said object and said image plane coaxial with said mirrors, said first and second mirrors being defined by aspherical coefficients effective to resolve image features of 0.05–0.25 μm with a telecentricity ≦1 mrad with distortions less than 0.1 of a resolution value for said object over an image field in said image plane of at least 10 mm ×10 mm when said illumination means is a partially coherent photon beam having a wavelength less than about 100 nm;

wherein said fist and second mirrors are separated at the respective vertices by a distance defined by $$0.48 \leq \frac{\text{Distance between Mirrors}}{\text{Radius of Curvature of said First Mirror and said Second Mirror}} \leq 0.54$$

where said first mirror and said second mirror each satisfy the relationship.

3. An optical system according to claim 2, wherein the ratio of the radius of curvature of said first mirror to said second mirror is in the range 0.98 to 1.02.

4. An optical system according to claim 3, wherein said image field is at least 25.4mm×25.4mm.

5. A reflecting optical system including illumination means or projecting an image of an object, said optical system further defining an image plane for receiving a reduced image representation of said object, the improvement comprising:

first and second coaxial aspherical mirrors in partially obscured arrangement and defining four reflecting surfaces between said object and said image plane coaxial with said mirrors, said firs and second mirrors being defined by aspherical coefficients effective to resolve image features with 0.05–0.25 μm with a telecentricity ≦1 mrad with distortions less than 0.1 of a resolution value for said object over an image field in said image plane of at least 10 mm ×10 mm when said illumination means is a partially coherent photon beam having a wavelength less than about 100 nm;

wherein said first and second mirrors are separated at the respective vertices by a distance defined by $$0.48 \leq \frac{\text{Distance between Mirrors}}{\text{Radius of Curvature of said First Mirror and said Second Mirror}} \leq 0.54$$

where said first mirror and said second mirror each satisfy the relationship and wherein the ratio of the radius of curvature of said first mirror to said second mirror is in the range 0.98 to 1.02.

6. An optical system according to claim 5, wherein said image field is at least 25.4 mm ×25.4 mm.

* * * * *